United States Patent [19]

Ichihara

[11] Patent Number: 5,521,559

[45] Date of Patent: May 28, 1996

[54] SIGNAL OSCILLATOR, FM MODULATION CIRCUIT USING THE SAME, AND FM MODULATION METHOD

[75] Inventor: Masaki Ichihara, Tokyo, Japan

[73] Assignee: NEC Corporation, Japan

[21] Appl. No.: 500,168

[22] Filed: Jul. 11, 1995

[30] Foreign Application Priority Data

Jul. 11, 1995 [JP] Japan .................................. 6-158761

[51] Int. Cl.$^6$ ........................... H03C 3/00; H04L 27/20
[52] U.S. Cl. ..................... 332/117; 332/103; 332/119; 375/308; 455/93; 455/110
[58] Field of Search ..................... 332/103, 117, 332/119; 375/279, 308; 455/42, 93, 102, 110, 112, 113

[56] References Cited

U.S. PATENT DOCUMENTS 5,225,795  7/1993  Iinuma ..................... 332/117 X

FOREIGN PATENT DOCUMENTS 2-220537  9/1990  Japan .
2-266705  10/1990  Japan .
3-179954  8/1991  Japan .
3-60502  9/1991  Japan .

*Primary Examiner*—David Mis
*Attorney, Agent, or Firm*—Ostrolenk, Faber, Gerb & Soffen

[57] ABSTRACT

A coefficient circuit 11 multiplies a digitized input modulation signal by a constant and outputs the multiplied signal. Delay circuits 12 and 13 delay the discrete in-phase input signal and discrete quadrature-phase input signal by 1 sampling cycle, respectively. A multiplying circuit 14 multiplies the multiplied signal by the 1-sampling cycle delayed discrete quadrature-phase input signal. The multiplying circuit 15 multiplies the multiplied signal by the 1-sampling cycle delayed discrete in-phase input signal. The adder circuit 16 adds the multiplication results of the multiplying circuit 14 to the 1-sampling cycle delayed discrete in-phase input signal and outputs the addition result as the discrete in-phase input signal. The subtracting circuit 17 subtracts the multiplication results of the multiplying circuit 15 from the 1-sampling cycle delayed discrete quadrature-phase input signal and outputs the subtraction result as the discrete quadrature-phase input signal.

13 Claims, 5 Drawing Sheets

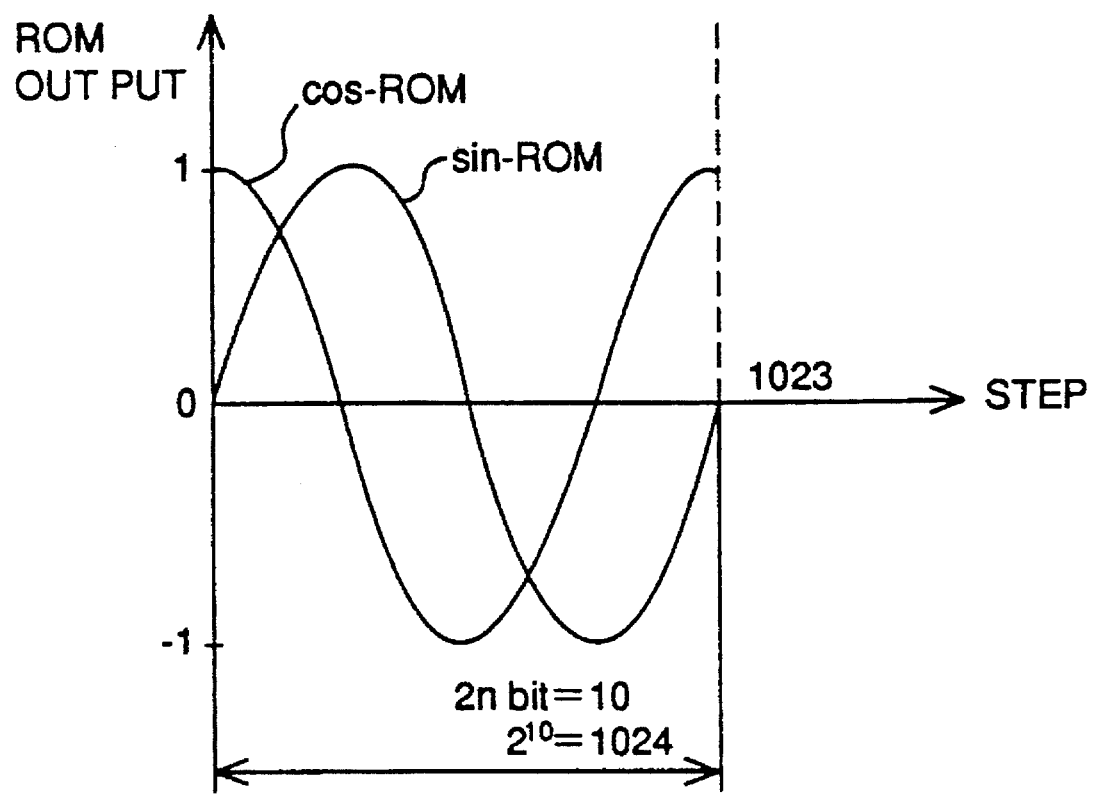

SIGNAL OSCILLATOR, FM MODULATION CIRCUIT USING THE SAME, AND FM MODULATION METHOD

BACKGROUND OF THE INVENTION

This invention relates to an art of FM modulation through digital signal processing for FM modulation by using a quadrature-phase modulator.

A conventional portable phone such as a cellular phone has generally used an FM modulation system. Recently a digital cellular system employing digital modulation has used a quadrature-phase modulator as a modulation circuit, especially used for the digital system.

In a specific area such as North America, however, the use of dual mode system as a combination of digital modulation and conventional analogue FM modulation in a portable phone has been specified as a next-generation cellular unit in view of compatibility with the conventional analogue cellular unit.

In order to realize the specified dual mode system, it is necessary to mount both quadrature-phase modulator and the analogue FM modulator in a unit.

Most of conventional FM modulations for the analogue cellular unit have been designed to modulate an oscillator directly with a voltage controlled oscillator (VCO). While a digital cellular unit uses modulation systems such as $\rho/4$ shift DQPSK, GMSK, QPSK, offset QPSK, and the like processed through a quadrature-phase modulator.

The North American area has specified the use of the dual mode system as a combination of the digital modulation system and conventional analogue cellular. So a compact portable phone has to be provided with both FM modulation and quadrature-phase modulation functions therein.

Realizing those functions in the respective circuits requires a number of parts, thus failing to realize the compact unit at a low price. As a result, the FM modulation eventually demands the use of a quadrature-phase modulator as its indispensable component.

With the above method, an input signal for FM modulation is A/D converted to produce an in-phase input signal I and a quadrature-phase input signal Q as base band input signals for the quadrature-phase modulation through digital signal processing, which are supplied to the quadrature-phase modulator.

A publication of Japanese Patent Laid-Open No. 3-60502(1991) titled "Digital FM modulator" has disclosed a method for generating the aforementioned in-phase input signal I and the quadrature-phase input signal Q from the input modulation signal. The disclosed method is hereinafter explained referring to the drawing.

FIG. 5 shows a digital FM modulator based on the disclosed method. The digital FM modulator comprises an integrator 70 for integrating an input modulation signal supplied to an input terminal 71, and a phase modulator 40 for phase modulating an output of the integrator 70.

The integrator 70 comprises a delay register 73 for executing 1 sampling cycle delay, and an adder 74 for adding the output of the register 73 to the input modulation signal, which functions in integrating by adding the input modulation signal to the output of the register 73 sequentially by each sample.

The output of the integrator 70 is derived from integrating the output of the modulation signal proportional to frequency to become a phase signal. The phase signal is input to the phase modulator 40. Using the input phase signal as an address, values stored in cosine ROM 42 and sine ROM 43 are read as the in-phase input signal I and the quadrature-phase input signal Q, respectively.

FIG. 6 shows stored contents of the cosine ROM 42 and sine ROM 43. In FIG. 6, an axis of ordinate denotes the stored contents of the ROMs, and an axis of abscissa denotes the address.

The in-phase input signal I and the quadrature-phase input signal Q output from the cosine ROM 42 and sine ROM 43 are multiplied with carrier signals with phase shifted by 90° at multipliers 45 and 46, respectively, which are added together at an adder 49. The addition result is converted into an analogue signal through a D/A converter 50. After eliminating unnecessary wave of the converted analogue signal at a band pass filter 51, it is output as an FM modulated signal 52.

This example intends to apply video signals of a video recorder to FM modulation with a carrier at a low frequency. Its quadrature-phase modulator is realized through digital signal processing.

In another prior art relevant to this invention, "Digitized quadrature-phase modulator" has been disclosed in a publication of Japanese Patent Laid-Open No. 3-179954 (1991) (hereinafter referred to as Prior Art 1). The disclosed modulator is so constructed to operate a counter ROM with a phase shifted by 180° and an operation for the part unselected from a data selector has been preliminary omitted to decrease the speed to access the ROM with operation results by half compared with conventional access speed.

In the Prior Art 1, an in-phase input signal and quadrature-phase input signal are respectively stored in a first and a second shift registers sequentially where clock signals at a predetermined frequency are supplied from a clock control circuit, which assigns low significant addresses to a first ROM and a second ROM, respectively. The first ROM and the second ROM receive the low significant addresses from the first counter and the second counter. The first ROM and the second ROM, then, output the first and the second 1 bit signals. The first and the second 1 bit signals are alternately selected by a data selector to be output as a selected 1 bit signal. The selected 1 bit signal is formed into a digital analogue signal with its analogue signal output as a modulation output signal.

A publication of Japanese Patent Laid-Open No. 2-266705 (1990) (hereinafter referred to as Prior Art 2) has disclosed "FM modulator" for multiplying quadrature first and second modulation signals and quadrature first and second carrier signals to be added to provide an output having excellent linearity with no high-order bias.

The Prior Art 2 converts an input digital video signal into two quadrature digital video signals. A phase modulator receives quadrature first and second carrier signals. The first modulation signal and the first carrier signal are supplied to a first multiplier, and the second modulation signal and the second carrier signal are supplied to a second multiplier, respectively. The multiplied outputs of the first and the second multipliers are added through the adder to provide an output in which the only phase of the second carrier signal is modulated. This may eliminate non-linearity in the input of voltage-to-output frequency as well as high-order bias contained in the FM modulated wave.

A publication of Japanese Patent Laid-Open No. 2-220537 (1990) (hereinafter referred to as Prior Art 3) has disclosed "Quadrature-phase modulator" which allows modulation signals to be output without changing the condition of waveform shaping through a MOSFET analogue filter with variable frequency characteristics to provide a monolithic integrated quadrature-phase modulator with high accuracy.

In the Prior Art 3, an input signal is input to a digital signal processing circuit through a switch. The digital signal processing circuit outputs 2 lines of digital signals with each phase orthogonalized with each other. The 2 lines of digital signals are D/A converted through a first and a second D/A converters to be input to a first and a second multipliers via a first and a second MOSFET analogue filters, respectively. The first and the second multipliers multiply outputs of the first and the second MOSFET analogue filters with carrier waves with each phase orthogonal thereto. The multiplication results of the first and the second multipliers are further added through the adder to be output. In this case, clock signals of the signal input to the digital signal processing circuit allow the frequency characteristics of the first and the second MOSFET analogue filters to be varied so as to eliminate harmonics component contained in the output signals of the first and the second D/A converters.

The aforementioned Prior Arts obtain an in-phase input signal I and a quadrature-phase input signal Q by integrating the input modulation signal, and reading the cosine ROM and the sine ROM using integrated results as addresses. A large capacity of cosine ROM and sine ROM are eventually required by enlarging the chip size in the form of LSI, resulting in price increase.

The Prior Art 1 requires the ROMs, thus having the same drawback as aforementioned. The Prior Art 2 also requires a large capacity of cosine ROMs and sine ROMs. The Prior Art 3 has a digital signal processing circuit for outputting 2 lines of digital signals with each phase orthogonalized thereto, however, detailed construction of the circuit has not been described.

SUMMARY OF THE INVENTION

It is an object of the present invention to provide a low-priced FM modulation circuit with small sized chips.

It is another object of the present invention to provide an FM modulation circuit which allows effective use of the quadrature-phase modulator which has been unused in the analogue mode.

The objects of the present invention are realized by an FM modulation circuit comprising: means for multiplying a digitized input modulation signal by a constant and outputting a multiplied signal; first delay means for 1-sampling cycle delaying a discrete in-phase input signal converted from the input modulation signal and outputting a 1-sampling cycle delayed discrete in-phase input signal; second delay means for 1-sampling cycle delaying a discrete quadrature-phase input signal converted from the input modulation signal and outputting a 1-sampling cycle delayed discrete quadrature-phase input signal; first multiplication means for multiplying the multiplied signal by the 1-sampling cycle delayed discrete quadrature-phase input signal and outputting a first multiplication result signal; second multiplication means for multiplying the multiplied signal with the 1-sampling cycle delayed discrete in-phase input signal to output a second multiplication result signal; means for adding the first multiplication result signal to the 1-sampling cycle delayed discrete in-phase input signal and outputting an addition result as the discrete in-phase input signal; means for subtracting the second multiplication result signal from the 1-sampling cycle delayed discrete quadrature-phase input signal and outputting a subtraction result as the discrete quadrature-phase input signal; D/A conversion means for D/A converting the discrete in-phase input signal and the discrete quadrature-phase input signal into a base band in-phase input signal and a base band quadrature-phase input signal, respectively; and quadrature-phase modulation means for generating an FM modulated wave by quadrature-phase modulating a carrier with the base band in-phase input signal and the base band quadrature-phase input signal.

Moreover, the object of the present invention are realized by an FM modulation method comprising the steps of; multiplying a digitized input modulation signal by a constant; multiplying the multiplied input modulation signal by a 1-sampling cycle precedent discrete quadrature-phase input signal $Q_{n-1}$ to obtain a first multiplication result; multiplying the multiplied input modulation signal by a 1-sampling cycle precedent discrete in-phase input signal $I_{n-1}$ to obtain a second multiplication result; adding the first multiplication result to the discrete in-phase input signal $I_{n-1}$ to obtain an addition result as a discrete in-phase input signal In; subtracting the second multiplication result from the discrete quadrature-phase input signal $Q_{n-1}$ to obtain a subtraction result as a discrete quadrature-phase input signal $Q_n$; D/A converting the discrete in-phase input signal $I_n$ and the discrete quadrature-phase input signal $Q_n$ into a base band in-phase input signal and a base band quadrature-phase input signal, respectively; and generating an FM modulated wave by quadrature-phase modulating a carrier wave with the base band in-phase input signal and the base band quadrature-phase input signal.

The present invention has a circuit with a very simple construction requiring no cosine ROM or sine ROM. It allows the quadrature-phase modulator which has been unused in the analogue mode to be effectively adapted to the FM modulation circuit. By this, conventional analogue FM modulators may be eliminated to reduce the number of parts used in a dual mode cellular phone with functions of both digital and analogue modulators. As a result, the present invention realizes a compact circuit at a low price.

BRIEF DESCRIPTION OF THE DRAWINGS

This and other objects, features and advantages of the present invention will become more apparent upon a reading of the following detailed description and drawings, in which:

FIG. 6 is an explanatory view showing an example of contents stored in the cosine ROM and the sine ROM in FIG. 5.

DESCRIPTION OF THE PREFERRED EMBODIMENTS

Figure 1:
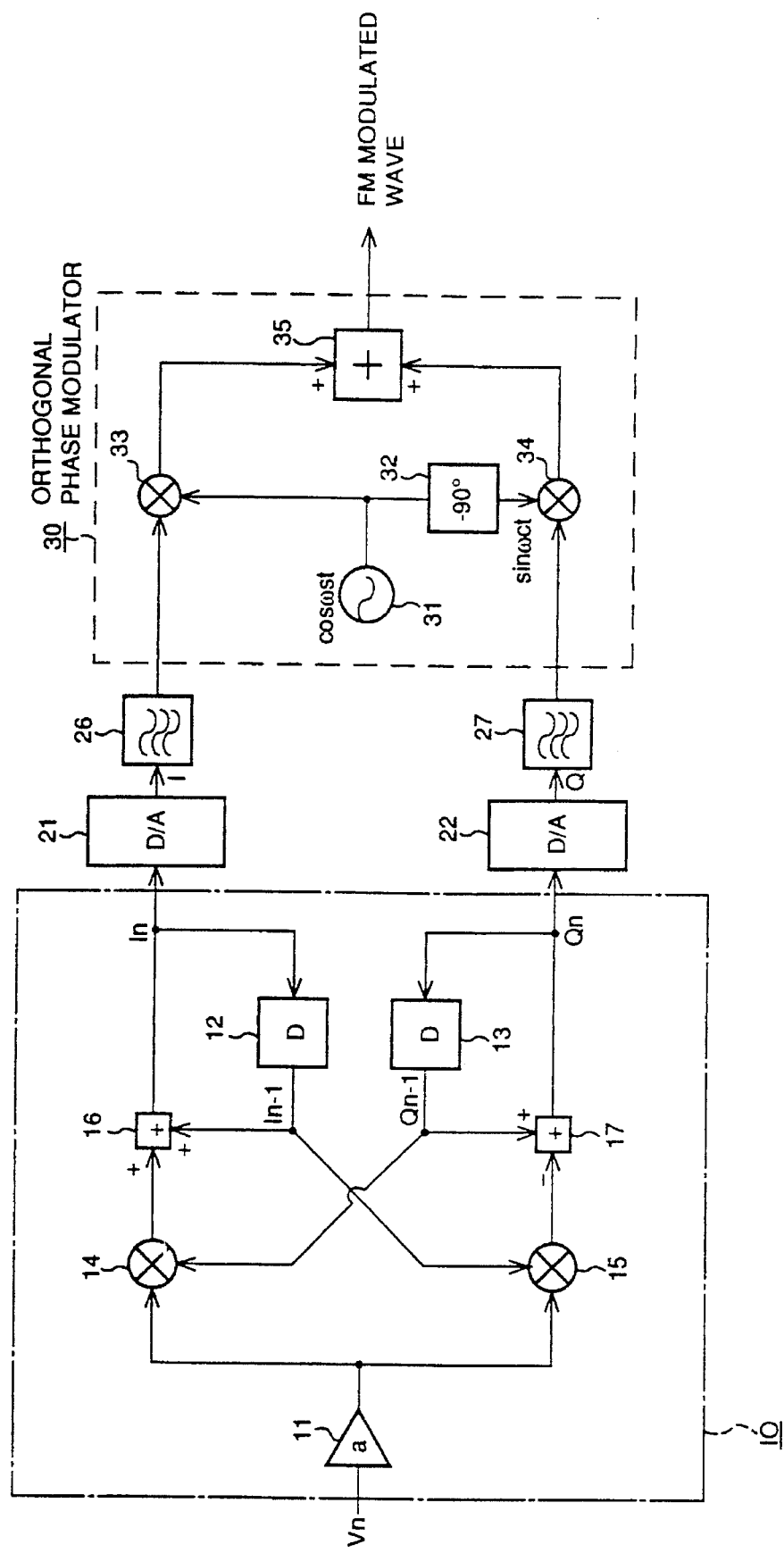
FIG. 1 is a block diagram showing a construction of an FM modulation circuit of a first embodiment of the present invention.

A principle of the present invention is described. Generally an FM modulated (hereinafter referred to simply as FM)

signal waveform f(t) is expressed by the following equation 1:

$$f(t) = A \cdot \cos\left\{ \omega_c t + \alpha \int_0^t v(t)dt + \theta \right\} = A \cdot \cos\phi(t) \quad 1$$

where t is a time (second), A is a constant representing amplitude of an FM wave, $\alpha$ is a constant representing modulation sensitivity (radian/V/second), v(t) is an input modulation signal (V), $\omega_c$ is an angle frequency (radian/second), and $\theta$ is a phase (radian) at a time of t=0.

Using the above equation 1, an instantaneous angle frequency $\omega(t)$ is obtained from the following equation 2.

$$\omega(t) = d\phi(t)/dt = \omega_c + \alpha \cdot v(t) \quad 2$$

A signal waveform f(t) expressed by the equation 1 is varied in the form expressed by the following equation 3.

$$f(t) = A \cdot \cos(\omega_c t + \theta) \cdot \cos\left\{ \alpha \int_0^t v(t)dt \right\} - $$

$$A \cdot \sin(\omega_c t + \theta) \cdot \sin\left\{ \alpha \int_0^t v(t)dt \right\} \quad 3$$

In the equation 3, A·cos ($\omega_c t+\theta$) is a cosine component of the carrier wave and A·sin ($\omega_c t+\theta$), is a sine component orthogonal to the cosine component. Therefore coefficients I(t) and Q(t) of those cosine and sine components are expressed by the following equations 4 and 5, respectively.

$$I(t) = \cos\left\{ \alpha \int_0^t v(t)dt \right\} \quad 4$$

$$Q(t) = -\sin\left\{ \alpha \int_0^t v(t)dt \right\} \quad 5$$

The coefficients I(t) and Q(t) are in-phase input signal I and quadrature-phase input signal Q of the base band signal for quadrature-phase modulation, respectively. It is assumed that the in-phase input signal I and the quadrature-phase input signal Q are obtained through D/A conversion of the discrete in-phase input signal $I_n$ and the discrete quadrature-phase input signal $Q_n$ derived from digital signal processing input modulation wave v(t). In the above case, the discrete in-phase and quadrature-phase input signals $I_n$ and $Q_n$ are expressed by the following equations 6:

$$I_n = I(nt) = \cos\left\{ \alpha \sum_{i=0}^{n} v(T/2 + i \cdot T) \cdot T \right\} \quad 6$$

$$Q_n = Q(nt) = -\sin\left\{ \alpha \sum_{i=0}^{n} v(T/2 + i \cdot T) \cdot T \right\}$$

where n denotes the number of n=0, 1, 2, ..., $\infty$, and T is a sampling interval (second) for A/D or D/A conversion.

Supposing that the input modulation signal v(t) is A/D converted into a value vn at an interval of T, the vn is expressed by the following equation 7.

$$v_n = v(T/2 + i \cdot T) \quad 7$$

Using the digitized input modulation signal vn, the equation 6 may be divided into the following equations 8 and 9.

$$\begin{aligned} I_n &= \cos\left\{ \alpha \sum_0^{n-1} vi \cdot T \right\} \cos(\alpha Tvn) - \\ &\quad \sin\left\{ \alpha \sum_0^{n-1} vi \cdot T \right\} \sin(\alpha Tvn) \\ &= I_{n-1} \cdot \cos(\alpha Tvn) + Q_{n-1} \cdot \sin(\alpha Tvn) \end{aligned} \quad 8$$

$$\begin{aligned} Q_n &= -\sin\left\{ \alpha \sum_0^{n-1} vi \cdot T \right\} \cos(\alpha Tvn) - \\ &\quad \cos\left\{ \alpha \sum_0^{n-1} vi \cdot T \right\} \sin(\alpha Tvn) \\ &= Q_{n-1} \cdot \cos(\alpha Tvn) - I_{n-1} \cdot \sin(\alpha Tvn) \end{aligned} \quad 9$$

With the dual mode cellular system specified in the North American area, maximum frequency of deviation wave at analogue FM modulation is 12 kHz, and the sampling rate of the modulation signal used for CDMA (Dual mode cellular system using Code Division Multiple Access method based on TIA standard IS95) is approximately 9.8304 MHz. So the values of $\alpha$Tvn in the equations 8 and 9 become very small shown as follows:

$\alpha$Tvn$\leq$12 KHz×2$\pi$/9.8304 MHz=0.00767 radian.

The following equation 10 is obtained.

cos ($\alpha$Tvn)$\cong$1 sin($\alpha$Tvn)$\cong\alpha$Tvn    10

Substituting the equations 10 for the equations 8 and 9 may simplify the equations as expressed by the following equations 11.

$I_n \cong I_{n-1} + Q_{n-1} \cdot \alpha Tvn$ $Q_n \cong Q_{n-1} - I_{n-1} \cdot \alpha Tvn$    11

The above explanation shows that the discrete in-phase input signal $I_n$ and the discrete quadrature-phase input signal $Q_n$ of the quadrature-phase modulator are derived from the difference equation as the equation 11 with delayed in-phase input signal $I_{n-1}$, that is, 1 sampling cycle precedent value, the delayed quadrature-phase input signal $Q_{n-1}$ and the input modulation signal vn which has been A/D converted at the sampling cycle T. The present invention provides the circuit construction which realizes the difference equations 11.

The preferred embodiments are hereinafter described referring to drawings.

FIG. 1 is a block diagram showing an FM modulation circuit of a first embodiment.

The FM modulation circuit comprises an input component converting circuit 10, a first and a second D/A converters 21 and 22, a first and a second filters 26 and 27 and a quadrature-phase modulator 30.

The input component converting circuit 10 comprising a digital signal processing circuit serves to convert an input modulation signal vn into a discrete in-phase input signal $I_n$ and a discrete quadrature-phase input signal $Q_n$. The input modulation signal vn is derived from A/D converting the input modulation wave v(t) through the A/D converter (not shown) at a sampling cycle T. The input component converting circuit 10 comprises a coefficient circuit 11, a first and a second delay registers 12 and 13, a first and a second multipliers 14 and 15, an adder 16 and a subtracter 17.

The coefficient circuit 11 multiplies the input modulation signal vn by "a" times and outputs the signal which has been multiplied by a constant. The value "a" is selected to the value $\alpha T$ of the equation 11. As a result, the signal multiplied by a constant to be output from the coefficient circuit 11 is equal to the value $\alpha Tvn$. The thus multiplied signal is supplied to the first and the second multipliers 14 and 15.

The discrete in-phase input signal $I_n$ and discrete quadrature-phase input signal $Q_n$ output from the input component converting circuit 10 are supplied to a first and a second delay registers 12 and 13, respectively.

The first delay register 12 delays the discrete in-phase input signal $I_n$ by 1 sampling cycle and outputs a delayed in-phase input signal $I_{n-1}$. The delayed in-phase input signal $I_{n-1}$ is supplied to the second multiplier 15 and the adder 16.

The second delay register 13 delays the discrete quadrature-phase input signal $Q_n$ by 1 sampling cycle and outputs a delayed quadrature-phase input signal $Q_{n-1}$. The delayed quadrature-phase input signal $Q_{n-1}$ is supplied to the first multiplier 14 and the subtracter 17.

The first multiplier 14 multiplies the multiplied signal by the delayed quadrature-phase input signal $Q_{n-1}$ and outputs a first multiplication result signal, which is supplied to the adder 16. The adder 16 adds the first multiplication result signal to the delayed in-phase input signal $I_{n-1}$ and outputs the addition result signal as a discrete in-phase input signal In.

The second multiplier 15 multiplies the multiplied signal by the delayed in-phase input signal $I_{n-1}$ and outputs a second multiplication result signal. The second multiplication result signal is supplied to the subtracter 17. The subtracter 17 subtracts the second multiplication result signal from the delayed quadrature-phase input signal $Q_{n-1}$ and outputs the subtraction result signal as the discrete quadrature-phase input signal $Q_n$.

The input component converting circuit 10 provides the discrete in-phase input signal $I_n$ and discrete quadrature-phase input signal $Q_n$ of the base band of the quadrature-phase modulator 30 by repeating recursive processing described above.

The discrete in-phase input signal $I_n$ and discrete quadrature-phase input signal $Q_n$ are supplied to the first and the second D/A converters 21 and 22, respectively.

The first D/A converter 21 D/A converts the discrete in-phase input signal $I_n$ and outputs a base band in-phase input signal I. The base band in-phase input signal I is subjected to the process for eliminating unnecessary wave through the first filter 26, and then supplied to the quadrature-phase modulator 30.

The second D/A converter 22 D/A converts the discrete quadrature-phase input signal $Q_n$ and outputs a base band quadrature-phase input signal Q. The base band quadrature-phase input signal Q is subjected to the process for eliminating unnecessary wave through the second filter 27, and then supplied to the quadrature-phase modulator 30.

The quadrature-phase modulator 30 comprises an oscillator 31, a phase shifter 32, a first and a second double-balanced mixers 33 and 34 and an adder circuit 35.

The oscillator 31 generates a base carrier (in-phase carrier) $\cos \omega_c t$ to be supplied to the phase shifter 32. The phase shifter 32 delays the phase of the in-phase carrier $\cos \omega_c t$ by 90° and outputs the quadrature carrier $\sin \omega_c t$.

The in-phase carrier $\cos \omega_c t$ and the base band in-phase input signal I are supplied to the first double-balanced mixer 33.

The quadrature carrier $\sin \omega_c t$ and the base band quadrature-phase input signal Q are supplied to the second double-balanced mixer 34.

The first double-balanced mixer 33 multiplies the in-phase carrier $\cos \omega_c t$ by the base band in-phase input signal I and outputs a modulated in-phase component signal.

The second double-balanced mixer 34 multiplies the quadrature carrier $\sin \omega_c t$ by the base band quadrature-phase input signal Q and outputs a modulated quadrature component signal.

The modulated in-phase component signal and modulated quadrature component signal are supplied to the adder circuit 35. The adder circuit 35 adds the modulated quadrature component signal to the modulated in-phase component signal and outputs an FM modulated wave. The FM modulated wave is equivalent to the signal derived from FM modulating the carrier $\cos \omega_c t$ with the input modulation signal vn.

Next, a second embodiment is described.

Figure 2:
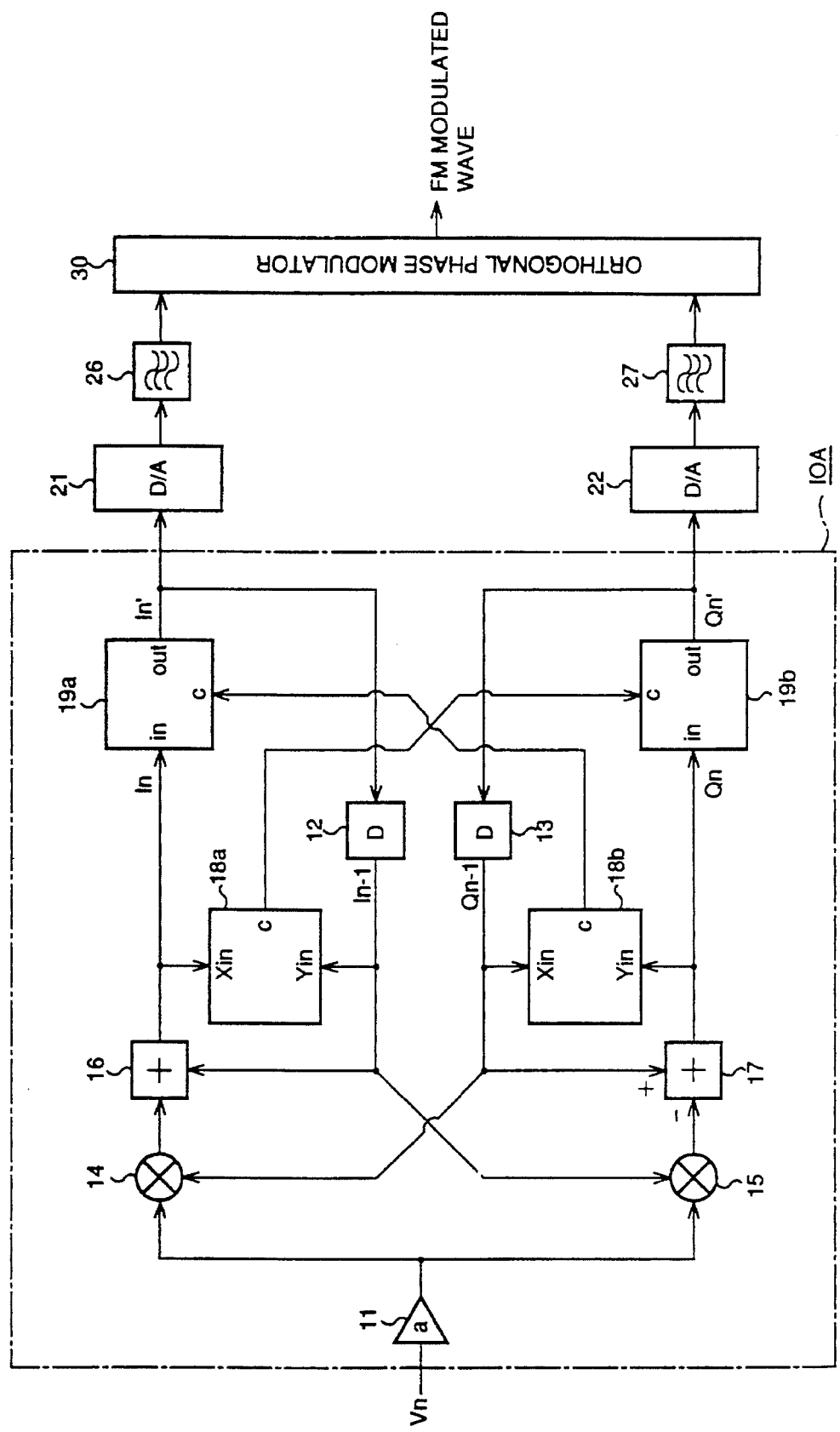
FIG. 2 is a block diagram showing a construction of an FM modulation circuit of a second embodiment of the present invention.

FIG. 2 is a block diagram of the FM modulation circuit of the second embodiment.

The FM modulation circuit shown in FIG. 2 comprises an input component converting circuit 10A with a circuit for improving amplitude stability added to the input component converting circuit 10 of the FM modulation circuit shown in FIG. 1. The input component converting circuit 10 shown in FIG. 1 may cause the amplitude to be unstable in relation with time which is influenced by approximation executed at the equation 11, quantization error resulted from A/D conversion, round-down error of the multipliers, and the like. The input component converting circuit 10A of FIG. 2 is provided with a circuit to prevent the above mentioned instability.

The input component converting circuit 10A has the same construction as that of the input component converting circuit 10 except a first and a second zero-cross detection circuits 18a and 18b, a first and a second amplitude correction circuits 19a and 19b added thereto.

The first and the second zero-cross detection circuits 18a and 18b comprise a first and a second data input terminals $X_{in}$, $Y_{in}$ and control signal output terminals C.

In the first zero-cross detection circuit 18a, the first data input terminal $X_{in}$ receives a discrete in-phase input signal $I_n$ as a first input data. The second data input terminal Yin receives a delayed in-phase input signal $I_{n-1}$ as a second input data.

In the second zero-cross detection circuit 18b, the first data input terminal $X_{in}$ receives a delayed quadrature-phase input signal $Q_{n-1}$ as a first input data. The second data input terminal Yin receives a discrete quadrature-phase input signal $Q_n$ as a second input data.

The first zero-cross detection circuit 18a detects the polar difference between the discrete in-phase input signal $I_n$ and the delayed input signal $I_{n-1}$. The second zero-cross detection circuit 18b likewise detects the polar difference between the discrete quadrature-phase input signal $Q_n$ and the delayed quadrature-phase input signal $Q_{n-1}$.

Figure 3:
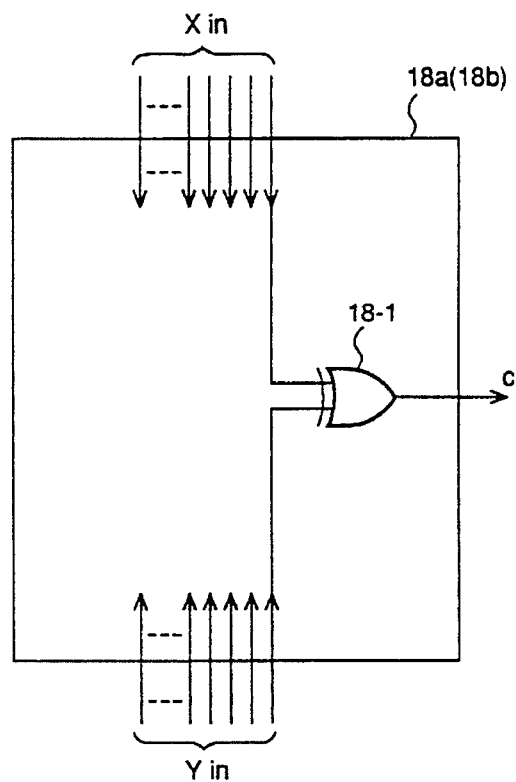
FIG. 3 is a circuit diagram showing a construction of a zero-cross detection circuit in FIG. 2.

Referring to FIG. 3, detailed explanation of the first zero-cross detection circuit 18a (the second zero-cross detection circuit 18b) is described. It is well known that the first and the second input data have sine bits. Each of the first and the second detection circuits 18a and 18b is constructed with exclusive OR gate 18-1.

The exclusive OR gate 18-1 obtains exclusive OR of the sine bits of the first input data and the second input data and outputs the resultant exclusive OR signal from the control signal output terminal C as a zero-cross detection signal.

With the first zero-cross detection circuit 18a, in case the discrete in-phase input signal $I_n$ has the same polarity as that of the delayed in-phase input signal $I_{n-1}$, the output of the exclusive OR gate 18-1 becomes "0" level. In case of different polarity, i.e., the discrete in-phase input signal $I_n$ zero crosses, the first zero-cross detection signal at logical level "1" is output.

With the second zero-cross detection circuit 18b, in case the discrete quadrature-phase input signal $Q_n$ has the same polarity as that of the delayed quadrature-phase input signal $Q_{n-1}$, the output of the exclusive OR gate 18-1 becomes "0" level. In case of different polarity, i.e., the discrete quadrature-phase input signal $Q_n$ zero crosses, the second zero-cross detection signal at logical level "1" is output.

Referring to FIG. 2 again, the first and the second amplitude correction circuits 19a and 19b have data input terminals in, data output terminal "out", and control signal input terminals C, respectively.

With the first amplitude correction circuit 19a, the data input terminal in receives the discrete in-phase input signal $I_n$ as an input data signal, and the control signal input terminal C receives the second zero-cross detection signal, which outputs a corrected in-phase input signal In' as output data from the data output terminal "out".

With the second amplitude correction circuit 19b, the data input terminal in receives the discrete quadrature-phase input signal $Q_n$ as input data, and the control signal input terminal C receives the zero-cross detection signal, which outputs a corrected quadrature-phase input signal $Q_n'$ as output data from the data output terminal "out".

Upon receiving the second zero-cross detection signal at logical level "1", i.e., when the discrete quadrature-phase input signal $Q_n$ zero crosses, the first amplitude correction circuit 19a outputs the in-phase input signal In' with the same polarity as that of the input discrete in-phase input signal $I_n$ which has been corrected to a preset amplitude value instead of the discrete in-phase input signal In. The output is read into the first delay register 12.

Upon receiving the first zero-cross detection signal at logical level "1", i.e., when the discrete in-phase input signal $I_n$ zero crosses, the second amplitude correction circuit 19b outputs the quadrature-phase input signal $Q_n'$ with the same polarity as that of the input discrete quadrature-phase input signal $Q_n$ which has been corrected to a preset amplitude value instead of the discrete quadrature-phase input signal $Q_n$. The output is read into the second delay register 13.

As aforementioned, every time when the discrete in-phase input signal $I_n$ and the discrete quadrature-phase input signal $Q_n$ zero cross, each amplitude of those signals is corrected, thus preventing unstable variation in the amplitude.

Figure 4:
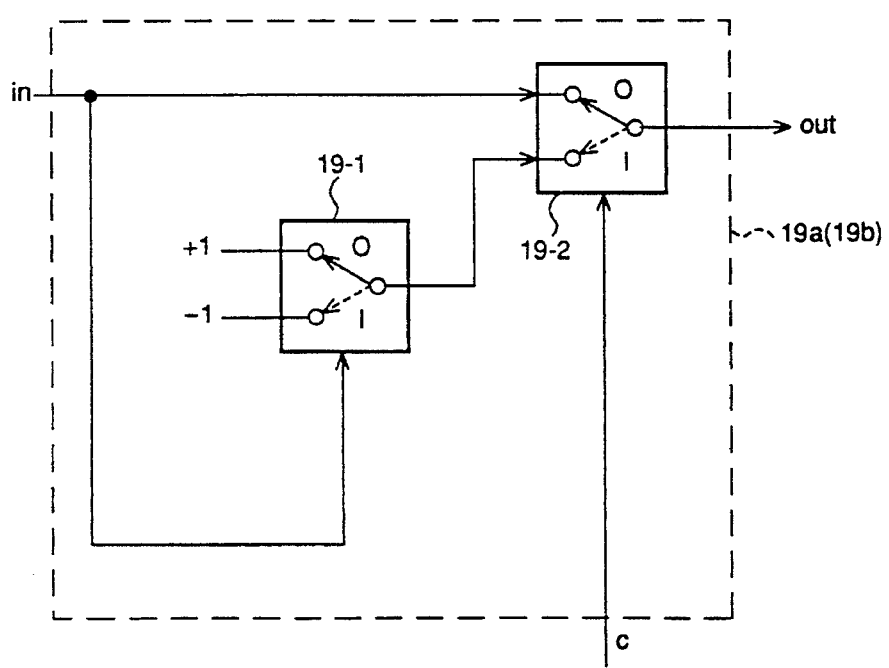
FIG. 4 is a circuit diagram showing a construction of an amplitude correction circuit in FIG. 2.
Figure 5:
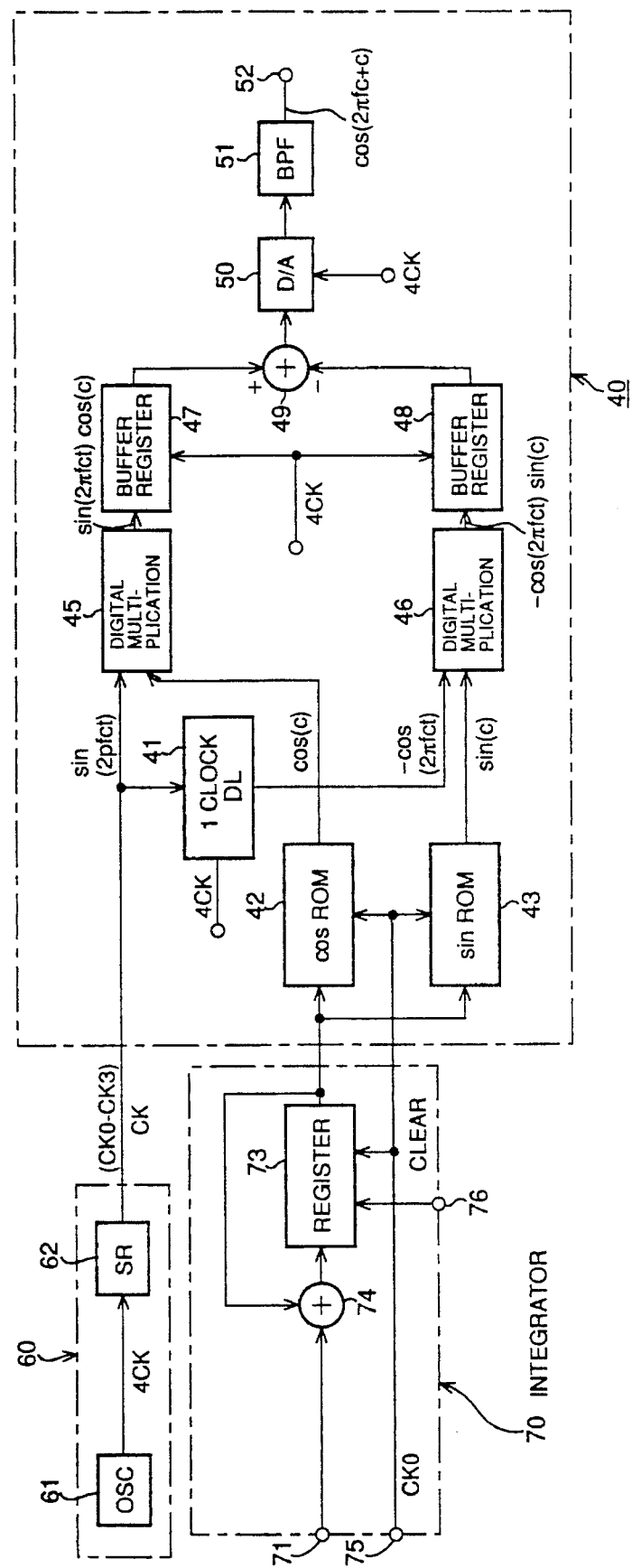
FIG. 5 is a block diagram showing a construction of a conventional digital FM modulator.

Referring to FIG. 4, a detailed explanation of the first amplitude correction circuit 19a (the second amplitude correction circuit 19b) is described.

The first amplitude correction circuit 19a and the second amplitude correction circuit 19b have a first and a second data selectors 19-1 and 19-2, respectively.

The first data selector 19-1 receives a sine bit of the input data supplied to the data input terminal in as a selected signal. The first data selector 19-1 also receives both positive and negative amplitude values.

In this invention, the positive amplitude value is set to +1, and the negative amplitude value is set to −1. If the sine bit of the input data is positive, i.e., at logical level "0", the first data selector 19-1 selects the positive amplitude value +1 as a selected value. While if the sine bit of the input data is negative, i.e., at logical level "1", the first data selector 19-1 selects the negative amplitude value −1 as a selected value.

The selected amplitude value is supplied to one input terminal of the second data selector 19-2 to which a zero-cross detection signal is supplied as a selected signal.

If the zero-cross detection signal is at logical level "0", i.e., zero-cross is not detected, the second data selector 19-2 outputs the input data (discrete in-phase input signal $I_n$ or discrete quadrature-phase input signal $Q_n$), as is, supplied from the data input terminal in as output data (corrected in-phase input signal In' or quadrature-phase input signal $Q_n'$) from a data output terminal "out".

If the zero-cross detection signal is at logical level "1", i.e., zero-cross is detected, the second data selector 19-2 outputs the selected amplitude value supplied from the first data selector 19-1 as output data from the data output terminal "out".

It is further understood that the form of the invention shown and described is to be taken as preferred embodiments thereof and that various changes may be resorted to without departing from the spirit of the invention or the scope of the claims. For example, various systems other than that shown in FIG. 4 may be available for the amplitude correction means.

What is claimed is:

1. An FM modulation circuit comprising:
   means for multiplying a digitized input modulation signal by a constant and outputting a multiplied signal;
   first delay means for 1-sampling cycle delaying a discrete in-phase input signal converted from said input modulation signal and outputting a 1-sampling cycle delayed discrete in-phase input signal;
   second delay means for 1-sampling cycle delaying a discrete quadrature-phase input signal converted from said input modulation signal and outputting a 1-sampling cycle delayed discrete quadrature-phase input signal;
   first multiplication means for multiplying said multiplied signal by said 1-sampling cycle delayed discrete quadrature-phase input signal and outputting a first multiplication result signal;
   second multiplication means for multiplying said 1-sampling cycle delayed discrete in-phase input signal by said multiplied signal and outputting a second multiplication result signal;
   means for adding said first multiplication result signal to said 1-sampling cycle delayed discrete in-phase input signal and outputting an addition result as said discrete in-phase input signal;
   means for subtracting said second multiplication result signal from said 1-sampling cycle delayed discrete quadrature-phase input signal and outputting a subtraction result as said discrete quadrature-phase input signal;
   D/A conversion means for D/A converting said discrete in-phase input signal and said discrete quadrature-phase input signal into a base band in-phase input signal and a base band quadrature-phase input signal, respectively; and
   quadrature-phase modulation means for generating an FM modulated wave by quadrature-phase modulating a carrier with said base band in-phase input signal and said base band quadrature-phase input signal.

2. The FM modulation circuit of claim 1, further comprising:
   first zero-cross detection means for detecting a polar difference between said discrete in-phase input signal and said 1-sampling cycle delayed discrete in-phase signal and outputting a first zero-cross detection signal when having detected a polar difference;
   second zero-cross detection means for detecting a polar difference between said discrete quadrature-phase input signal and said 1-sampling cycle delayed discrete quadrature-phase input signal and outputting a second zero-cross detection signal when having detected a polar difference;

first amplitude correction means for correcting an amplitude of said input discrete in-phase input signal to a preset amplitude with the same polarity as that of said discrete in-phase input signal based on said second zero-cross detection signal and outputting a result, as a corrected discrete in-phase input signal and instead of said discrete in-phase input signal, to said first delay means; and second amplitude correction means for correcting an amplitude of an input discrete quadrature-phase input signal to a preset amplitude with the same polarity as that of said discrete quadrature-phase input signal based on said first zero-cross detection signal and outputting a result, as a corrected discrete quadrature-phase input signal and instead of said discrete quadrature-phase input signal, to said second delay means.

3. The FM modulation circuit of claim 2, wherein said first zero-cross detection means further comprises a first exclusive OR gate for calculating exclusive OR of sine bit of said discrete in-phase input signal and sine bit of said 1-sampling cycle delayed discrete in-phase input signal and outputting this calculation result as said first zero-cross detection signal; and said second zero-cross detection means further comprises a second exclusive OR gate for calculating exclusive OR of sine bit of said discrete quadrature-phase input signal and sine bit of said 1-sampling cycle delayed discrete quadrature-phase input signal and outputting this calculation result as said second zero-cross detection signal.

4. The FM modulation circuit of claim 2, wherein said first amplitude correction means further comprises:

first amplitude value selection means for selecting one of a preset positive amplitude value and a preset negative amplitude value based on sine bit of said discrete in-phase input signal and outputting a selected amplitude value as a first selected amplitude value;

first selection means for outputting said discrete in-phase input signal, as is, as said corrected discrete in-phase input signal when said second zero-cross detection signal has not been detected, and outputting said first selected amplitude value as said corrected discrete in-phase input signal when said second zero-cross detection signal has been detected, and said second amplitude correction means further comprises:

second amplitude value selection means for selecting one of a preset positive amplitude value and a preset negative amplitude value based on sine bit of said discrete quadrature-phase input signal and outputting a selected amplitude value as a second selected amplitude value; and second selection means for outputting said discrete quadrature-phase input signal, as is, as said corrected discrete quadrature-phase input signal when said first zero-cross detection signal has not been detected, and outputting said second selected amplitude value as said corrected discrete quadrature-phase input signal when said first zero-cross detection signal has been detected.

5. An FM modulation circuit comprising:

means for multiplying a digitized input modulation signal by a constant and outputting a multiplied signal;

first delay means for 1-sampling cycle delaying an in-phase input signal and outputting a result as a first delayed signal;

second delay means for 1-sampling cycle delaying an in-phase input signal and outputting a result as a second delayed signal;

first multiplication means for multiplying said multiplied signal by said second delayed signal and outputting a result as a first multiplication result signal;

second multiplication means for multiplying said multiplied signal by said first delayed signal and outputting a result as a second multiplication result signal;

means for adding said first multiplication result signal to said first delayed signal and outputting an addition result as a discrete in-phase input signal;

means for subtracting said second multiplication result signal from said second delayed signal and outputting a subtraction result as a discrete quadrature-phase input signal;

first zero-cross detection means for detecting a polar difference between said discrete in-phase input signal and said first delayed signal and outputting a first zero-cross detection signal when having detected a polar difference;

second zero-cross detection means for detecting a polar difference between said discrete quadrature-phase input signal and said second delayed signal and outputting a second zero-cross detection signal when having detected a polar difference;

first amplitude correction means for correcting an amplitude of said discrete in-phase input signal to a preset amplitude with the same polarity as that of said discrete in-phase input signal based on said second zero-cross detection signal and outputting a result as a corrected discrete in-phase input signal to said first delay means;

second amplitude correction means for correcting an amplitude of said discrete quadrature-phase input signal to a preset amplitude with the same polarity as that of said discrete quadrature-phase input signal based on said first zero-cross detection signal and outputting a result, as a corrected discrete quadrature-phase input signal, to said second delay means;

D/A conversion means for D/A converting said corrected discrete in-phase input signal and said corrected discrete quadrature-phase input signal into a base band in-phase input signal and a base band quadrature-phase input signal, respectively; and quadrature-phase modulation means for generating an FM modulated wave by quadrature-phase modulating a carrier with said base band in-phase input signal and said base band quadrature-phase input signal.

6. The FM modulation circuit of claim 5, wherein said first zero-cross detection means further comprises a first exclusive OR gate for calculating exclusive OR of sine bit of said discrete in-phase input signal and sine bit of said first delayed signal and outputting this calculation result as said first zero-cross detection signal; and said second zero-cross detection means further comprises a second exclusive OR gate for calculating exclusive OR of sine bit of said discrete quadrature-phase input signal and sine bit of said second delayed signal and outputting this calculation result as said second zero-cross detection signal.

7. The FM modulation circuit of claim 5, wherein said first amplitude correction means further comprises:

first amplitude value selection means for selecting one of a preset positive amplitude value and a preset negative amplitude value based on sine bit of said discrete in-phase input signal and outputting a selected amplitude value as a first selected amplitude value; and first selection means for outputting said discrete in-phase input signal, as is, as said corrected discrete in-phase input signal when said second zero-cross detection signal has not been detected, and outputting said first selected amplitude value as said corrected discrete in-phase input signal when said second zero-cross detection signal has been detected, and said second amplitude correction means further comprises:

second amplitude value selection means for selecting one of a preset positive amplitude value and a preset negative amplitude value based on sine bit of said discrete quadrature-phase input signal and outputting a selected amplitude value as a second selected amplitude value; and second selection means for outputting said discrete quadrature-phase input signal, as is, as said corrected discrete quadrature-phase input signal when said first zero-cross detection signal has not been detected, and outputting said second selected amplitude value as said corrected discrete quadrature-phase input signal when said first zero-cross detection signal has been detected.

8. A signal oscillator oscillating an in-phase signal and a quadrature-phase signal that are orthogonal each other, comprising:

means for multiplying a digitized input signal by a constant and outputting a multiplied signal;

first delay means for 1-sampling cycle delaying an in-phase input signal and outputting a result as a first delayed signal;

second delay means for 1-sampling cycle delaying an quadrature-phase input signal and outputting a result as a second delayed signal;

first multiplication means for multiplying said multiplied signal by said second delayed signal and outputting a result as a first multiplication result signal;

second multiplication means for multiplying said multiplied signal by said first delayed signal and outputting a result as a second multiplication result signal;

means for adding said first multiplication result signal to said first delayed signal and outputting an addition result as said in-phase signal; and means for subtracting said second multiplication result signal from said second delayed signal and outputting a subtraction result as said quadrature-phase signal.

9. The signal oscillator of claim 8, comprising:

first zero-cross detection means for detecting a polar difference between said in-phase signal and said first delayed signal and outputting a first zero-cross detection signal when having detected a polar difference;

second zero-cross detection means for detecting a polar difference between said quadrature-phase signal and said second delayed signal and outputting a second zero-cross detection signal when having detected a polar difference;

first amplitude correction means for correcting an amplitude of said in-phase signal to a preset amplitude with the same polarity as that of said in-phase signal based on said second zero-cross detection signal and outputting said corrected in-phase signal to said first delay means; and second amplitude correction means for correcting an amplitude of said quadrature-phase signal to a preset amplitude with the same polarity as that of said quadrature-phase signal based on said first zero-cross detection signal and outputting said corrected quadrature-phase signal to said second delay means.

10. The signal oscillator of claim 9, wherein said first zero-cross detection means further comprises a first exclusive OR gate for calculating exclusive OR of sine bit of said in-phase signal and sine bit of said first delayed signal and outputting this calculation result as said first zero-cross detection signal; and said second zero-cross detection means further comprises a second exclusive OR gate for calculating exclusive OR of sine bit of said quadrature-phase signal and sine bit of said second delayed signal and outputting this calculation result as said second zero-cross detection signal.

11. The signal oscillator of claim 9, wherein said first amplitude correction means further comprises:

first amplitude value selection means for selecting one of a preset positive amplitude value and a preset negative amplitude value based on sine bit of said in-phase signal and outputting a selected amplitude value as a first selected amplitude value; and first selection means for outputting said in-phase signal as is, when said second zero-cross detection signal has not been detected, and outputting said first selected amplitude value as said in-phase signal when said second zero-cross detection signal has been detected, and said second amplitude correction means comprises:

second amplitude value selection means for selecting one of a preset positive amplitude value and a preset negative amplitude value based on sine bit of said quadrature-phase signal and outputting a selected amplitude value as a second selected amplitude value; and second selection means for outputting said quadrature-phase signal as is, when said first zero-cross detection signal has not been detected, and outputting said second selected amplitude value as said quadrature-phase signal when said first zero-cross detection signal has been detected.

12. An FM modulation method comprising the steps of;

multiplying a digitized input modulation signal by a constant;

multiplying said multiplied input modulation signal by a 1-sampling cycle precedent discrete quadrature-phase input signal Qn-1 to obtain a first multiplication result;

multiplying said multiplied input modulation signal by a 1-sampling cycle precedent discrete in-phase input signal In-1 to obtain a second multiplication result;

adding said first multiplication result to said 1-sampling cycle precedent discrete in-phase input signal In-1 to obtain an addition result as a discrete in-phase input signal In;

subtracting said second multiplication result from said discrete quadrature-phase input signal Qn-1 to obtain a subtraction result as a discrete quadrature-phase input signal Qn;

D/A converting said discrete in-phase input signal In and said discrete quadrature-phase input signal Qn into a base band in-phase input signal and a base band quadrature-phase input signal, respectively; and generating an FM modulated wave by quadrature-phase modulating a carrier wave with said base band in-phase input signal and said base band quadrature-phase input signal.

13. The FM modulation method of claim 12, further comprising the steps of;

detecting a polar difference between said 1-sampling cycle precedent discrete in-phase input signal $I_{n-1}$ and said discrete in-phase signal $I_n$;

detecting a polar difference between said 1-sampling cycle precedent discrete quadrature-phase input signal $Q_{n-1}$ and said discrete quadrature-phase input signal $Q_n$;

correcting an amplitude of said discrete quadrature-phase input signal $Q_n$ to a preset amplitude with the same polarity as that of said discrete quadrature-phase input signal $Q_n$ when the polarity of said 1-sampling cycle precedent discrete in-phase input signal $I_{n-1}$ is different from that of said discrete in-phase input signal $I_n$; and correcting an amplitude of said discrete in-phase input signal $I_n$ to a preset amplitude with the same polarity as that of said discrete in-phase input signal $I_n$ when the polarity of said 1-sampling cycle precedent discrete quadrature-phase input signal $Q_{n-1}$ is different from that of said discrete quadrature-phase input signal $Q_n$.

\* \* \* \* \*